US012813357B2

(12) United States Patent
Yang et al.

(10) Patent No.: US 12,813,357 B2
(45) Date of Patent: Nov. 24, 2026

(54) VERTICALLY INTEGRATED MEMORY SYSTEM AND ASSOCIATED SYSTEMS AND METHODS

(71) Applicant: Micron Technology, Inc., Boise, ID (US)

(72) Inventors: Lingming Yang, Meridian, ID (US); Raghukiran Sreeramaneni, Frisco, TX (US); Nevil N. Gajera, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 139 days.

(21) Appl. No.: 18/749,416

(22) Filed: Jun. 20, 2024

(65) Prior Publication Data

US 2025/0022849 A1 Jan. 16, 2025

Related U.S. Application Data

(60) Provisional application No. 63/525,904, filed on Jul. 10, 2023.

(51) Int. Cl.

| | |
|---|---|
| ***H10W 90/00*** | (2026.01) |
| ***G11C 11/4072*** | (2006.01) |
| ***G11C 11/4096*** | (2006.01) |
| ***H10B 80/00*** | (2023.01) |
| *H10W 90/20* | (2026.01) |

(52) U.S. Cl.
CPC ......... *H10W 90/00* (2026.01); *G11C 11/4072* (2013.01); *G11C 11/4096* (2013.01); *H10B 80/00* (2023.02); *H10W 90/297* (2026.01)

(58) Field of Classification Search
CPC ........................... H10W 90/00; H10W 90/297; G11C 11/4072; G11C 11/4096; G11C 7/1069; G11C 7/18; G11C 29/816; G11C 5/066; G11C 11/005; G11C 5/025; G11C 5/04;
(Continued)

(56) References Cited

U.S. PATENT DOCUMENTS 9,432,298 B1 8/2016 Smith
10,719,445 B1 * 7/2020 Navon ............... G06F 12/0868
(Continued)

OTHER PUBLICATIONS

EP Patent Application No. 24187493.2—Extended European Search Report and Written Opinion, dated Dec. 12, 2024, 10 pages.

*Primary Examiner* — Fernando Hidalgo
(74) *Attorney, Agent, or Firm* — Dorsey & Whitney LLP

(57) ABSTRACT

System-in-packages (SiPs) having combined high bandwidth memory (HBM) devices, and associated systems and methods, are disclosed herein. In some embodiments, the SiP includes a base substrate (e.g., a silicon interposer), a processing unit carried by the base substrate, and a HBM device carried by the base substrate. The combined HBM device can be electrically coupled to the processing unit through one or more traces. Further, the combined HBM device can include an interface die, one or more volatile memory dies carried by the interface die (e.g., a volatile, main memory component), and one or more non-volatile memory dies carried by the one or more memory dies. The combined HBM device can also include a shared bus that is electrically coupled to the interface die, the volatile memory dies, and the non-volatile memory dies to establish communication paths therebetween.

18 Claims, 9 Drawing Sheets

(58) Field of Classification Search
CPC ..... G11C 5/063; H10B 80/00; G06F 12/0868; G06F 12/0877; G06F 12/0897
USPC .......................................................... 365/189.11
See application file for complete search history.

(56) References Cited

U.S. PATENT DOCUMENTS

| | | | | |
|---|---|---|---|---|
| 2018/0210830 | A1 | 7/2018 | Malladi et al. | |
| 2021/0210500 | A1* | 7/2021 | Lin | H10B 41/27 |
| 2021/0391303 | A1* | 12/2021 | Lung | G11C 11/005 |
| 2022/0188606 | A1* | 6/2022 | Roberts | G06N 3/0464 |

* cited by examiner

VERTICALLY INTEGRATED MEMORY SYSTEM AND ASSOCIATED SYSTEMS AND METHODS

CROSS-REFERENCE TO RELATED APPLICATION(S)

The present application claims priority to U.S. Provisional Patent Application No. 63/525,904, filed Jul. 10, 2023, the disclosure of which is incorporated herein by reference in its entirety.

TECHNICAL FIELD

The present technology is generally related to vertically stacked semiconductor devices and more specifically to stacked volatile and non-volatile memory dies for semiconductor packages.

BACKGROUND

Microelectronic devices, such as memory devices, microprocessors, and other electronics, typically include one or more semiconductor dies mounted to a substrate and encased in a protective covering. The semiconductor dies include functional features, such as memory cells, processor circuits, imager devices, interconnecting circuitry, etc. To meet continual demands on decreasing size, wafers, individual semiconductor dies, and/or active components are typically manufactured in bulk, singulated, and then stacked on a support substrate (e.g., a printed circuit board (PCB) or other suitable substrates). The stacked dies can then be coupled to the support substrate (sometimes also referred to as a package substrate) through bond wires in shingle-stacked dies (e.g., dies stacked with an offset for each die) and/or through substrate vias (TSVs) between the dies and the support substrate.

Figure 1:
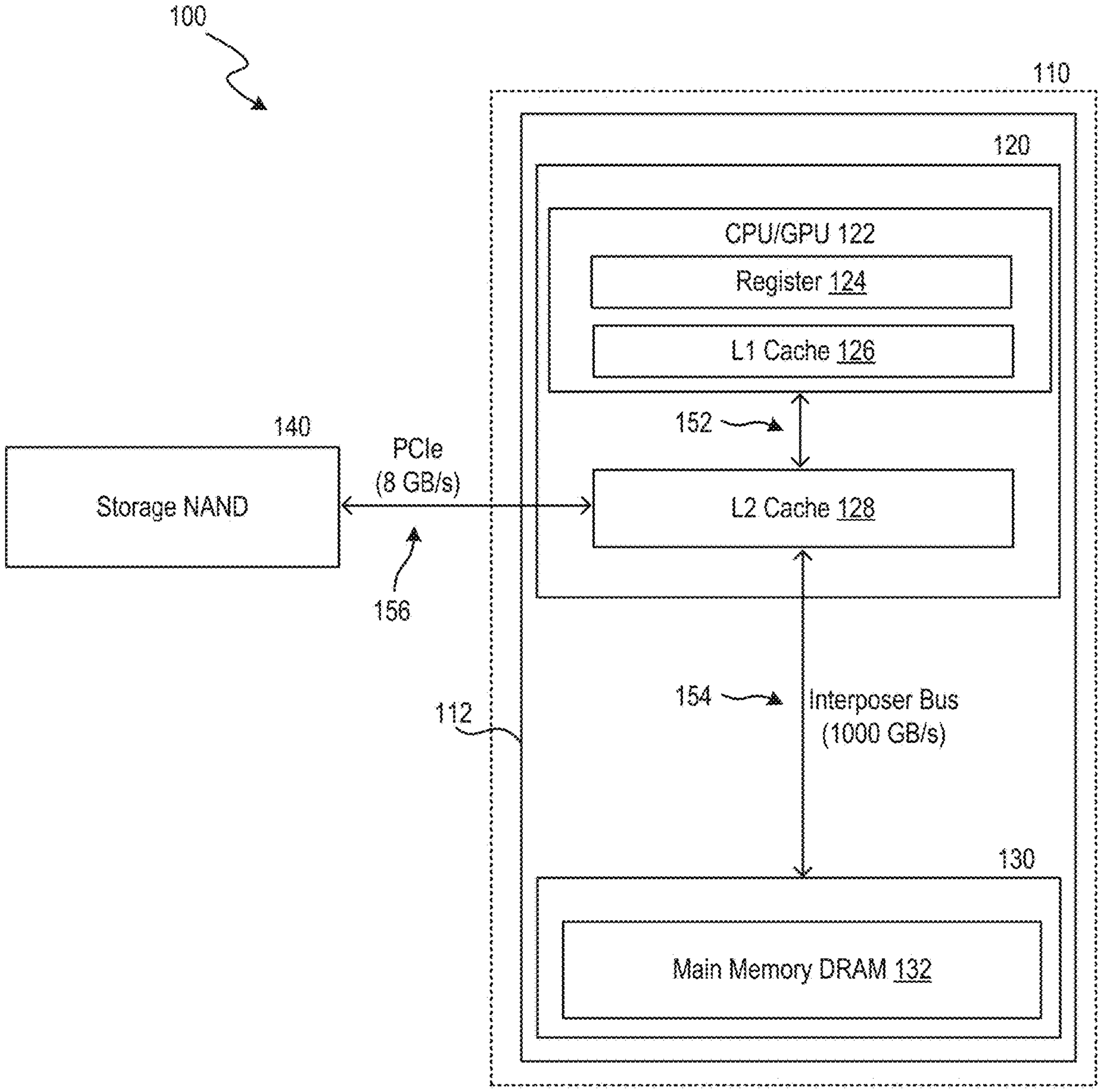
FIG. 1 is a schematic diagram illustrating an environment that incorporates a high-bandwidth memory architecture.

The drawings have not necessarily been drawn to scale. Further, it will be understood that several of the drawings have been drawn schematically and/or partially schematically. Similarly, some components and/or operations can be separated into different blocks or combined into a single block for the purpose of discussing some of the implementations of the present technology. Moreover, while the technology is amenable to various modifications and alternative forms, specific implementations have been shown by way of example in the drawings and are described in detail below. The intention, however, is not to limit the technology to the particular implementations described.

DETAILED DESCRIPTION

High data reliability, high speed of memory access, lower power consumption, and reduced chip size are features that are demanded from semiconductor memory. In recent years, three-dimensional (3D) memory devices have been introduced. Some 3D memory devices are formed by stacking memory dies vertically, and interconnecting the dies using through-silicon (or through-substrate) vias (TSVs). Benefits of the 3D memory devices include shorter interconnects (which reduce circuit delays and power consumption), a large number of vertical vias between layers (which allow wide bandwidth buses between functional blocks, such as memory dies, in different layers), and a considerably smaller footprint. Thus, the 3D memory devices contribute to higher memory access speed, lower power consumption, and chip size reduction. Example 3D memory devices include Hybrid Memory Cube (HMC) and High Bandwidth Memory (HBM). For example, HBM is a type of memory that includes a vertical stack of dynamic random-access memory (DRAM) dies and an interface die (which, e.g., provides the interface between the DRAM dies of the HBM device and a host device).

In a system-in-package (SiP) configuration, HBM devices may be integrated with a host device (e.g., a graphics processing unit (GPU) and/or computer processing unit (CPU)) using a base substrate (e.g., a silicon interposer, a substrate of organic material, a substrate of inorganic material and/or any other suitable material that provides interconnection between GPU/CPU and the HBM device and/or provides mechanical support for the components of an SiP device), through which the HBM devices and host communicate. Because traffic between the HBM devices and host device resides within the SiP (e.g., using signals routed through the silicon interposer), a higher bandwidth may be achieved between the HBM devices and host device than in conventional systems. In other words, the TSVs interconnecting DRAM dies within an HBM device, and the silicon interposer integrating HBM devices and a host device, enable the routing of a greater number of signals (e.g., wider data buses) than is typically found between packaged memory devices and a host device (e.g., through a printed circuit board (PCB)). The high-bandwidth interface within a SiP enables large amounts of data to move quickly between the host device (e.g., GPU/CPU) and HBM devices during operation. For example, the high-bandwidth channels can be on the order of 1000 gigabytes per second (GB/s, sometimes also referred to as gigabits (Gb)). It will be appreciated that such high-bandwidth data transfer between a GPU/CPU and the memory of HBM devices can be advantageous in various high-performance computing applications, such as video rendering, high-resolution graphics applications, artificial intelligence and/or machine learning (AI/ML) computing systems and other complex computational systems, and/or various other computing applications.

FIG. 1 is a schematic diagram illustrating an environment 100 that incorporates a high bandwidth memory architecture. As illustrated in FIG. 1, the environment 100 includes a SiP device 110 having one or more processing devices 120 (one illustrated in FIG. 1, sometimes also referred to herein as one or more "hosts"), and one or more HBM devices 130 (one illustrated in FIG. 1), integrated with a silicon interposer 112 (or any other suitable base substrate). The environment 100 additionally includes a storage device 140 coupled to the SiP device 110. The processing devices(s) 120 can include one or more CPUs and/or one or more GPUs, referred to as a CPU/GPU 122, each of which may include a register 124 and a first level of cache 126. The first level of cache 126 (also referred to herein as "L1 cache") is communicatively coupled to a second level of cache 128 (also referred to herein as "L2 cache") via a first communication path 152. In the illustrated embodiment, the L2 cache 128 is incorporated into the processing device(s) 120. However, it will be understood that the L2 cache 128 can be integrated into the SiP device 110 separate from the processing device(s) 120. Purely by way of example, the processing device(s) 120 can be carried by a base substrate (e.g., an interposer that is itself carried by a package substrate) adjacent to the L2 cache 128 and in communication with the L2 cache 128 via one or more signal lines (or other suitable signal route lines) therein. The L2 cache 128 may be shared by one or more of the processing devices 120 (and CPU/GPU 122 therein). During operation of the SiP device 110, the CPU/GPU 122 can use the register 124 and the L1 cache 126 to complete processing operations, and attempt to retrieve data from the larger L2 cache 128 whenever a cache miss occurs in the L1 cache 126. As a result, the multiple levels of cache can help accelerate the average time it takes for the processing device(s) 120 to access data, thereby accelerating the overall processing rates.

As further illustrated in FIG. 1, the L2 cache 128 is communicatively coupled to the HBM device(s) 130 through a second communication channel 154. As illustrated, the processing device(s) 120 (and L2 cache 128 therein) and HBM device(s) 130 are carried by and electrically coupled (e.g., integrated by) the silicon interposer 112. The second communication channel 154 is provided by the silicon interposer 112 (e.g., the silicon interposer includes and routes the interface signals forming the second communication channel, such as through one or more redistribution layers (RDLs)). As additionally illustrated in FIG. 1, the L2 cache 128 is also communicatively coupled to a storage device 140 through a third communication channel 156. As illustrated, the storage device 140 is outside of the SiP device 110, and utilizes signal routing components that are not contained within the silicon interposer 112 (e.g., between a packaged SiP device 110 and packaged storage device 140). For example, the third communication channel 156 may be a peripheral bus used to connect components on a motherboard or PCB, such as a Peripheral Component Interconnect Express (PCIe) bus. As a result, during operation of the SiP device 110, the processing device(s) 120 can read data from and/or write data to the HBM device(s) 130 and/or the storage device 140, through the L2 cache 128.

In the illustrated environment 100, the HBM devices 130 include one or more stacked volatile memory dies 132 (e.g., DRAM dies, one illustrated schematically in FIG. 1) coupled to the second communication channel 154. As explained above, the HBM device(s) 130 can be located on the silicon interposer 112, on which the processing device(s) 120 are also located. As a result, the second communication channel 154 can be provide a high bandwidth (e.g., on the order of 1000 GB/s) channel through the silicon interposer 112. Further, as explained above, each HBM device(s) 130 can provide a high bandwidth channel (not shown) between the volatile memory dies 132 therein. As a result, data can be communicated between the processing device(s) 120 and the HBM device(s) 130 (and the volatile memory dies 132 therein) at high speeds, which can be advantageous for data-intensive processing operations. Although the HBM device(s) 130 of the SiP device 110 provide relatively high bandwidth communication, their integration on the silicon interposer 112 suffers from certain shortcomings. For example, each HBM device(s) 130 may provide a limited amount of storage (e.g., on the order of 16 GB each), where the total storage provided by all of the HBM devices 130 may be insufficient to maintain the working data set of an operation to be performed by the SiP device 110. Additionally, or alternatively, the HBM device(s) 130 are made up of volatile memory (e.g., each requires power to maintain the stored data, and the data is lost once the HBM device is powered down and/or suffers an unexpected power loss).

In contrast to the characteristics of the HBM devices 130, the storage device 140 can provide a large amount of storage (e.g., on the order of terabytes and/or tens of terabytes). The greater capacity of the storage device 140 is typically sufficient to maintain the working data set of the complex operations to be performed by the SiP device 110. Additionally, the storage device 140 is typically non-volatile (e.g., made up of NAND-based storage, such as NAND flash, as illustrated in FIG. 1), and therefore retains stored data even after power is lost. However, as discussed above, the storage device 140 is located external to the SiP device 110 (e.g., not placed on the silicon interposer 112), and instead coupled to the SiP device 110 through a communication channel (e.g., PCIe) routed over a motherboard, system board, or other form of PCB. As a result, the third communication channel 156 can have a relatively low bandwidth (e.g., on the order of 8 GB/s), significantly lower than the bandwidth of the second communication channel 154. Consequently, processing operations involving large amounts of data (e.g., graphics rendering, AI/ML processes, and the like), which do not fit within the storage capacities of the HBM device 130, are bottlenecked by the low bandwidth of the third communication channel 156 as data moves between the storage device 140 and the SiP device 110. Additionally, power-down/power-up operations that require data to move between the storage device 140 and the SiP device 110 are bottlenecked by the relatively low bandwidth of the third communication channel 156.

HBM devices, and associated systems and methods, that address the shortcomings discussed above are disclosed herein. The HBM device can include one or more volatile memory dies (e.g., DRAM dies), one or more non-volatile memory dies (e.g., NAND dies, NOR dies, PCM dies, FeRAM dies, MRAM dies, and/or any other suitable dies), and an interface die. The HBM device can also include one or more TSVs that electrically couple the interface die, the one or more volatile memory dies, and the one or more non-volatile memory dies to establish communication paths therebetween. As described herein, the TSVs can provide a wide communication path (e.g., on the order of 1024 I/Os) between the volatile memory dies, non-volatile memory dies, and interface die of the HBM device, enabling high bandwidth therebetween. In other words, the disclosed HBM device combines both volatile memory and non-volatile memory (referred to herein as a "combined HBM device"), while providing high-bandwidth communication between the memories within the combined HBM device as well as between the combined HBM device and a coupled host device. As explained herein, embodiments of the combined HBM device may be integrated into an SiP device that combines one or more of the combined HBM devices and one or more host devices (e.g., processing deices comprising CPUs and/or GPUs). The combined HBM devices and host devices of the SiP device may be placed on and/or integrated with a silicon interposer, which may provide a high bandwidth communication channel between the combined HBM devices and host devices.

The volatile memory dies of the combined HBM device can provide functionality similar to the volatile memory dies 132 discussed above with reference to FIG. 1. That is, for example, the volatile memory dies can provide DRAM-based storage of a working data set, accessible via a high-bandwidth interface to one or more host devices (e.g., CPUs and/or GPUs of a SiP). As described herein, the non-volatile memory dies of the combined HBM device can enable various improvements over conventional HBM devices. In some embodiments, the non-volatile memory dies provide additional memory capacity that is usable by a coupled host device through a high bandwidth communication path (e.g., the non-volatile memory dies operate as a memory extension). In said embodiments, for example, a large dataset can be copied from a storage component to the memory extension (e.g., the non-volatile memory dies of the combined HBM device) through a low bandwidth communication path (e.g., PCIe) during an initialization phase. Then, during processing, portions of the large data set may be transferred between the non-volatile memory dies and the volatile memory dies of the combined HBM device, via the high bandwidth communication path of the combined HBM device, based on the portions of the large data set being processed at a time (e.g., the working data set). In some embodiments, the non-volatile memory dies provide non-volatile storage of some of the data stored in the volatile memory dies of the combined HBM device (e.g., the non-volatile memory dies operate as a non-volatile DRAM). In said embodiments, the non-volatile memory dies may not be usable by a host device (e.g., they may not increase the memory capacity that is made available to the host device and/or may not be used for their increase of memory capacity). In said embodiments, the non-volatile memory dies operating as non-volatile DRAM can save data from and restore data to the volatile memory dies in response to certain event, such as power-down and/or power-up. For example, in response to a power-down or idle request, data from the volatile memory dies and/or any of the caches can be stored in the non-volatile memory dies, in response to a power-down or idle request, to store a present state of the SiP device. Because the non-volatile memory dies are available through the high bandwidth communication path, the request can be satisfied much faster than communicating the data to a separate storage component (e.g., on the order of tens of milliseconds instead of several seconds). Similarly, in response to a power-up or wake-up request is received, the data can be moved back to the volatile memory dies and/or cache(s) through the high bandwidth communication paths. As a result, the saved state of the SiP can be restored, and the power-up request can be answered, within tens of milliseconds instead of the several seconds required when data must be loaded from the separate storage component.

Additional details on the combined HBM devices, and associated systems and methods, are set out below. For ease of reference, semiconductor packages (and their components) are sometimes described herein with reference to front and back, top and bottom, upper and lower, upwards and downwards, and/or horizontal plane, x-y plane, vertical, or z-direction relative to the spatial orientation of the embodiments shown in the figures. It is to be understood, however, that the semiconductor assemblies (and their components) can be moved to, and used in, different spatial orientations without changing the structure and/or function of the disclosed embodiments of the present technology. Additionally, signals within the semiconductor packages (and their components) are sometimes described herein with reference to downstream and upstream, forward and backward, and/or read and write relative to the embodiments shown in the figures. It is to be understood, however, that the flow of signals can be described in various other terminology without changing the structure and/or function of the disclosed embodiments of the present technology.

Further, although the memory device architectures disclosed herein are primarily discussed in the context of expanding memory capacity to improve artificial intelligence and machine learning models and/or to create non-volatile memory in a dynamic random-access memory (DRAM) component, one of skill in the art will understand that the scope of the technology is not so limited. For example, the systems and methods disclosed herein can also be deployed to expand the available high bandwidth memory for various other applications that process significant volumes of data (e.g., video rendering, decryption systems, and the like).

Figure 2:
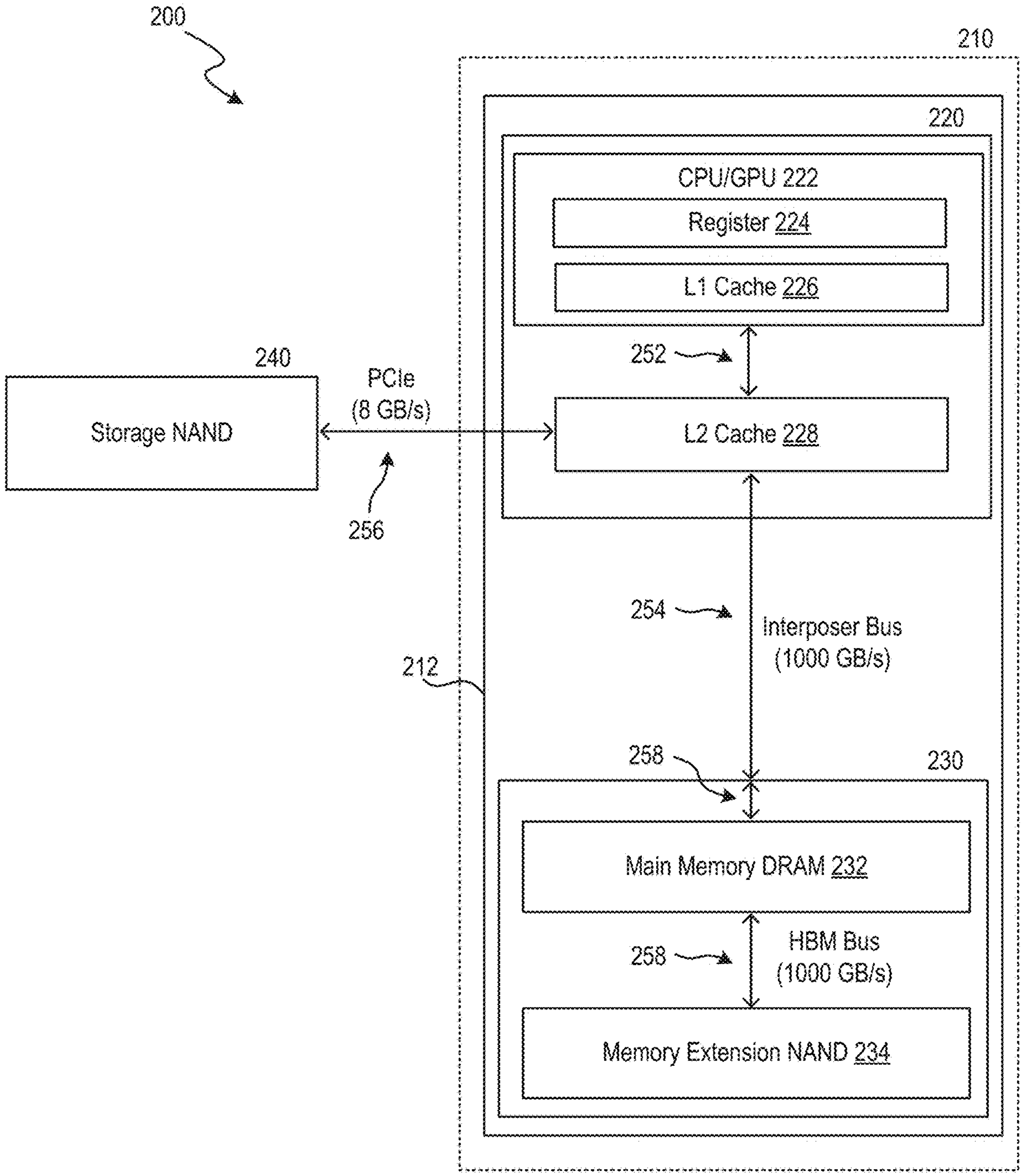
FIG. 2 is a schematic diagram illustrating an environment that incorporates a high-bandwidth memory architecture in accordance with some embodiments of the present technology.

FIG. 2 is a schematic diagram illustrating an environment 200 that incorporates an HBM architecture in accordance with some embodiments of the present technology. Similar to the environment 100 discussed above, the environment 200 includes a SiP device 210 having one or more processing devices 220 (one illustrated in FIG. 2) and one or more storage devices 240 (one illustrated in FIG. 2). However, in contrast to the SiP device 110 described in FIG. 1, embodiments of the SiP device 210 illustrated in FIG. 2 includes one or more combined HBM devices 230 (one illustrated in FIG. 2), described further below. The processing device(s) 220 and the combined HBM device(s) 230 are each integrated on an interposer 212 (e.g., a silicon interposer, another organic interposer, an inorganic interposer, and/or any other suitable base substrate) that can include one or more signal routing lines. The processing device(s) 220 is driven by a CPU/GPU 222 that includes a register 224 and a L1 cache 226. The L1 cache 226 is communicatively coupled to an L2 cache 128 via a first communication channel 252. Further, the L2 cache 228 is communicatively coupled to the combined HBM devices 230 through a second communication channel 254 and to the storage device 240 through a third communication channel 256. Still further, the second communication channel 254 can have a relatively high bandwidth (e.g., on the order of 1000 GB/s) while the third communication channel 256 can have a relatively low bandwidth (e.g., on the order of 8 GB/s).

In the embodiment illustrated in FIG. 2, the combined HBM device(s) 230 each include a stack of one or more volatile memory dies 232 (e.g., DRAM dies) as well as one or more non-volatile memory dies 234 (e.g., NAND dies, NOR dies, or other suitable memory dies). That is, one or more volatile memory dies 232, as well as one or more non-volatile memory dies 234, can be vertically stacked in the combined HBM device 230. The non-volatile memory dies 232 can operate similarly, and provide functionality similar to, the volatile memory dies 132 of the conventional HBM devices 230 illustrated in FIG. 1. Further, as discussed in more detail below, each of the volatile memory dies 232 and non-volatile memory dies 234 can be coupled to a high bandwidth bus in the combined HBM device(s) 230. For example, each HBM device 230 can include multiple TSVs that interconnect the volatile memory dies 232 and non-volatile memory dies 234 within the combined HBM device 230, thereby providing a high bandwidth bus. As discussed in more detail below, the combination of volatile memory and non-volatile memory within each combined HBM device 230 can provide certain advantages. For example, volatile memory such as DRAM typically provides accesses (e.g., reads and writes) that are relatively faster than non-volatile memory such as NAND, but at a lower density (e.g., storage capacity within a die footprint). In contrast, non-volatile memory such as NAND typically provides a high storage density, but can be relatively slow to access and can incur certain overheads (e.g., wear-leveling). As a result, the volatile memory die(s) 232 can provide low-latency fast communication, making data quickly available to the processing device(s) 220 of the SiP device 210 as needed. The non-volatile memory dies 234 can provide a relatively large memory capacity that is "closer" to the processing devices 220 (e.g., accessible within the SiP device 210 through high-bandwidth buses, such as the TSVs of the combined HBM devices 230 and the second communication channel 254) as compared to the storage device 240 (e.g., accessible through a slower channel, such as PCIe). Additionally, the non-volatile memory dies 234 can provide non-volatile memory capacity that is closer to the processing devices 220 and/or the volatile memory dies 232 as compared to the storage device 240 and/or other non-volatile memory capacity.

As a result, for example, a relatively large dataset can be communicated from the storage device 240 to the non-volatile memory die(s) 234 to initiate a processing operation (e.g., to run an AI/ML algorithm). For example, an entire dataset needed for an AI/ML operation can be copied from the storage device 240 to the non-volatile memory dies 234. Subsets of the dataset can then be rapidly communicated to the volatile memory die(s) 232 via an HBM bus 258, then to the processing device(s) 220 via the high bandwidth of the second communication channel 254 (sometimes also referred to herein as a "high bandwidth communication path"). When the processing devices(s) 220 is finished processing the subset, a new subset can be quickly written into the volatile memory die(s) 232 from the non-volatile memory die(s) 234, without needing to retrieve the data from the storage device 240 with the attendant bottleneck in the third communication channel 256 (sometimes also referred to herein as a "low bandwidth communication path"). Further, the processing operation can be iteratively executed (e.g., as is often the case for an AI/ML algorithm) without requiring the large dataset to be communicated through the bottleneck multiple times. Thus, the inclusion of the non-volatile memory die(s) 234 can increase the processing speed of the SiP device 210, thereby increasing the functionality of the environment 200. Further, because communicating data through high bandwidth channels is more efficient than communicating data through low bandwidth channels, the inclusion of the non-volatile memory die(s) 234 can reduce the overall power consumption of the environment 200 and/or reduce the heat generated by the environment 200.

Additionally, or alternatively, the non-volatile memory dies(s) 234 can save a copy of the data being processed and/or an overall state of the SiP device 210 in a non-volatile component. As a result, for example, the state of the volatile memory die(s) 232 does not need to be written between the volatile memory die(s) 232 and the storage device 240 to power down and/or power up. Instead, the state can be written to the non-volatile memory dies(s) 234. Thus, a power-down operation (sometimes also referred to herein as a "sleep operation" and/or an "idle operation") can be completed instantly (e.g., when a copy of the data is continuously stored in the non-volatile memory dies(s) 234) or almost instantly (e.g., when a copy is made via the HBM bus 258 in the combined HBM device 230). Similarly, a power-up operation (sometimes also referred to herein as a "wake up operation") can write the state back to the volatile memory die(s) 232 from the non-volatile memory die(s) 234 via the HBM bus 258, instead of from the storage device 240 via the third communication channel 256. As a result, the power-down and/or power-up operations can be accelerated from several seconds to much less than one second (e.g., tens of milliseconds). Additionally, or alternatively, the non-volatile memory dies(s) 234 can provide protection against a loss of power in the environment 200. For example, because the non-volatile memory die(s) 234 are coupled to the HBM bus 258, they can continuously save data (e.g., state of the SiP device 210) as the data is written to the volatile memory die(s) 232. In other words, the non-volatile memory die(s) 234 can operate as a non-volatile shadow of data written to the volatile memory die(s) 232. As a result, when power is lost, the non-volatile memory die(s) 234 will retain a state of the SiP device 210 after the last read/write operation between the processing device(s) 220 and the combined HBM device(s) 230, thereby reducing the chance that data is lost during operation of the environment 200 (and any electronic device the environment 200 is integrated into).

The environment 200 can be configured to perform any of a wide variety of suitable computing, processing, storage, sensing, imaging, and/or other functions. For example, representative examples of systems that include the environment 200 (and/or components thereof, such as the SiP device 210) include, without limitation, computers and/or other data processors, such as desktop computers, laptop computers, Internet appliances, hand-held devices (e.g., palm-top computers, wearable computers, cellular or mobile phones, automotive electronics, personal digital assistants, music players, etc.), tablets, multi-processor systems, processor-based or programmable consumer electronics, network computers, and minicomputers. Additional representative examples of systems that include the environment 200 (and/or components thereof) include lights, cameras, vehicles, etc. With regard to these and other examples, the environment 200 can be housed in a single unit or distributed over multiple interconnected units, e.g., through a communication network, in various locations on a motherboard, and the like. Further, the components of the environment 200 (and/or any components thereof) can be coupled to various other local and/or remote memory storage devices, processing devices, computer-readable storage media, and the like.

Additional details on the architecture of the environment 200, the SiP device 210, the combined HBM device(s) 230, and processes for operation thereof, are set out below with reference to FIGS. 3-9.

Figure 3:
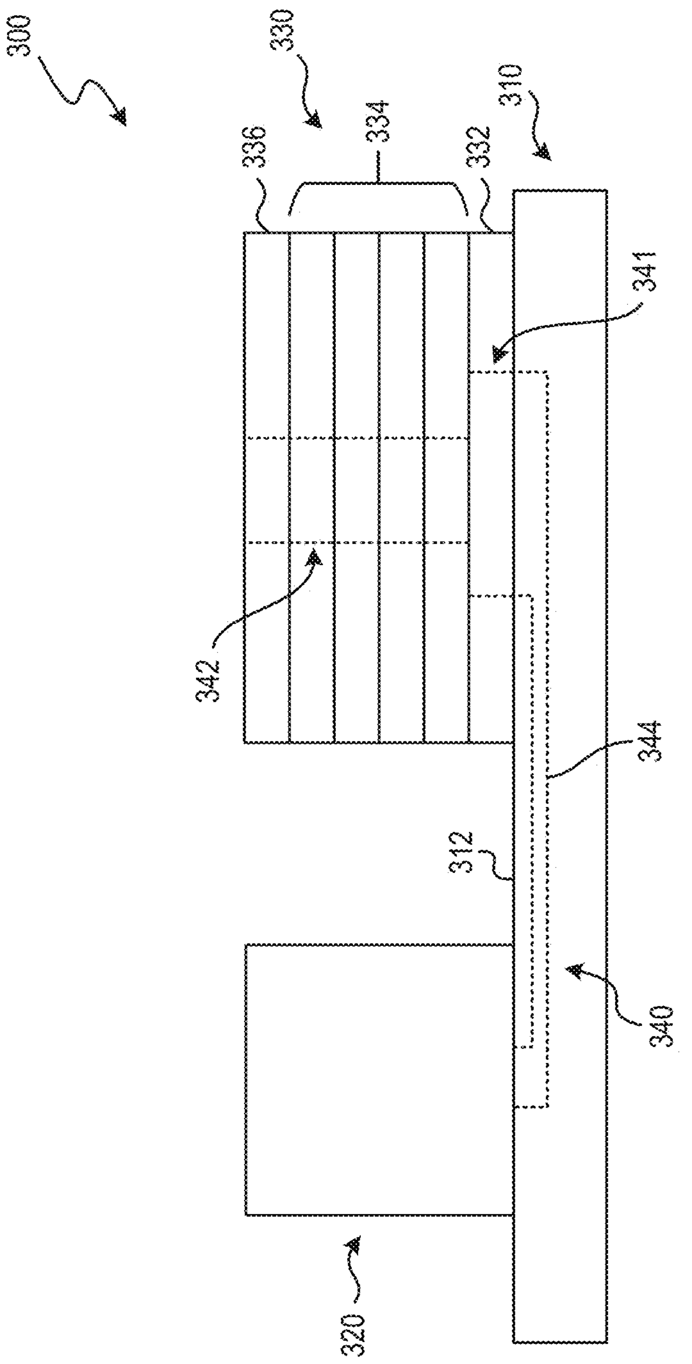
FIG. 3 is a partially schematic cross-sectional diagram of a system-in-package, with a combined high-bandwidth-memory device, configured in accordance with some embodiments of the present technology.

FIG. 3 is a partially schematic cross-sectional diagram of a SiP device 300, with a combined HBM device 330, configured in accordance with some embodiments of the present technology. As illustrated in FIG. 3, the SiP device 300 includes a base substrate 310 (e.g., a silicon interposer, another suitable organic substrate, an inorganic substrate, and/or any other suitable material), as well as a CPU/GPU 320 and the combined HBM device 330 each integrated with an upper surface 312 of the base substrate 310. In the illustrated embodiments, the CPU/GPU 320, and associated components (e.g., the register, L1 cache, and the like) is illustrated as a single package, and the combined HBM device 330 includes a stack of semiconductor dies. The stack of semiconductor dies in the combined HBM device 330 includes an interface die 332, one or more volatile memory dies 334 (four illustrated in FIG. 3), and one or more non-volatile memory dies 336 (one illustrated in FIG. 3). The CPU/GPU 320 is coupled to the combined HBM device 330 through a high bandwidth bus 340 that includes one or more route lines 344 (two illustrated schematically in FIG. 3) formed into (or on) the base substrate 310. In various embodiments, the route lines 344 can include one or more metallization layers formed in one or more RDL layers of the base substrate 310 and/or one or more vias interconnecting the metallization layers and/or traces. Further, although not illustrated in FIG. 3, it will be understood that the CPU/GPU 320 and the combined HBM device 330 can each be coupled to the route lines 344 via solder structures (e.g., solder balls), metal-metal bonds, and/or any other suitable conductive bonds.

As discussed in more detail below, the high bandwidth bus 340 can also include a plurality of through substrate vias 342 ("TSVs 342", see FIG. 4) extending from the interposer die 332, through the volatile memory dies 334, to the non-volatile memory die 336. The TSVs 342 allow each of the dies to communicate data within the combined HBM device 330 (e.g., between the volatile memory dies 334 (e.g., DRAM dies) and the non-volatile memory dies 336 (e.g., NAND dies)) at a relatively high rate (e.g., on the order of 1000 GB/s or greater). Additionally, the combined HBM device 330 can include one or more signal route lines 341 (e.g., additional TSVs extending through the interface die 332) that coupled the interface die 332 and/or the TSVs 342 to the route lines 344. In turn, the signal route lines 341, TSVs 342, and route lines 344 allow the dies in the combined HBM device 330 and the CPU/GPU 320 to communicate data at the high bandwidth.

Figure 4:
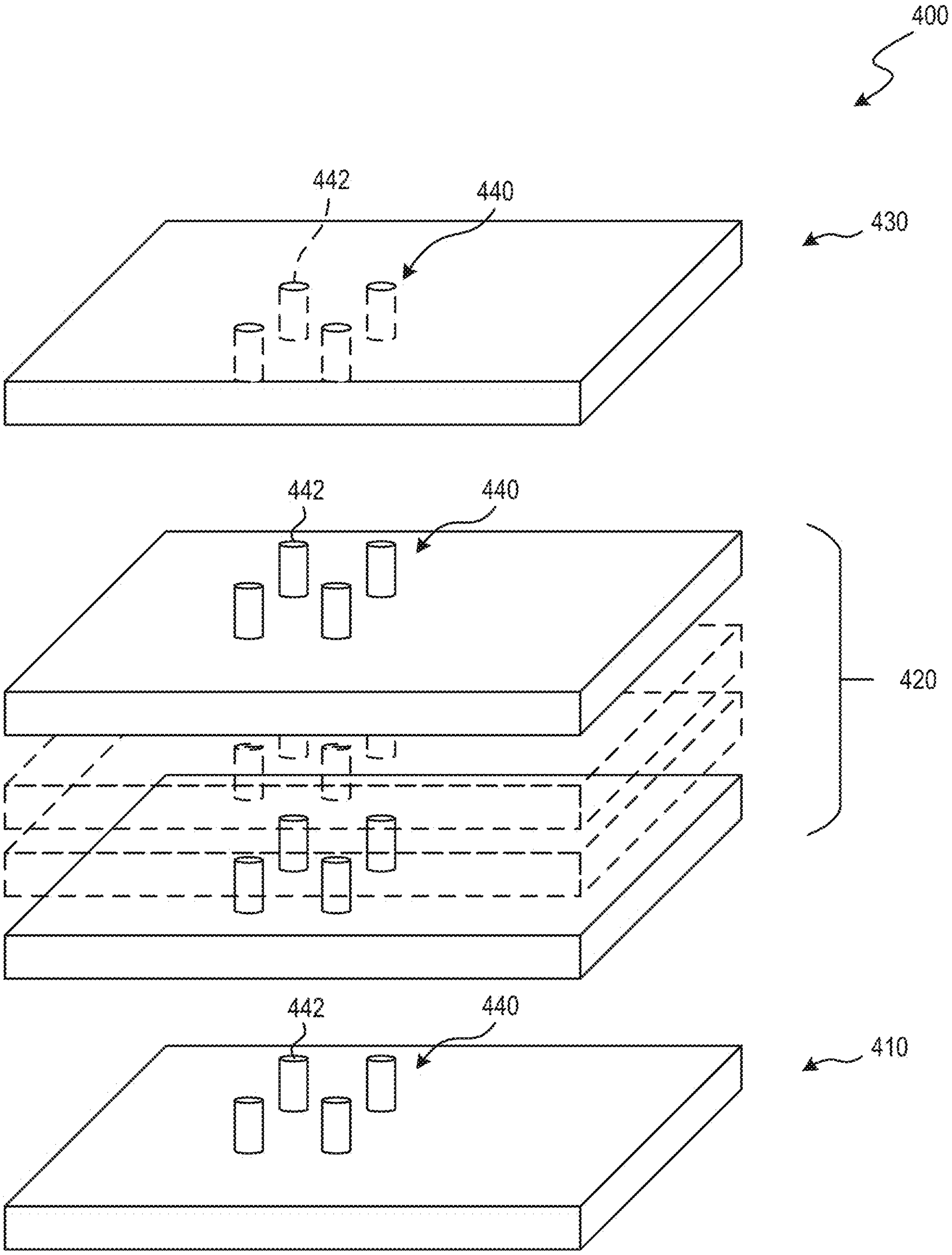
FIG. 4 is a partially schematic exploded view of a combined high-bandwidth memory device configured in accordance with some embodiments of the present technology.

FIG. 4 is a partially schematic exploded view of a combined HBM device 400 configured in accordance with some embodiments of the present technology. For example, the combined HBM device 400 can be used as the combined HBM device 330 discussed above with reference to FIG. 3. In the illustrated embodiment, the combined HBM device 400 is a stack of dies that includes an interface die 410, one or more volatile memory dies 420 (four illustrated in FIG. 4), and one or non-volatile memory dies 430 (one illustrated in FIG. 4). Further, the combined HBM device 400 includes a shared HBM bus 440 communicatively coupling the interface die 410, the volatile memory dies 420, and the non-volatile memory die 430.

The interface die 410 can be a physical layer ("PHY") that establishes electrical connections between the shared HBM bus 440 and external components of the shared HBM bus 440 (e.g., the route lines 344 of FIG. 3). Additionally, or alternatively, the interface die 410 can include one or more active components, such as a static random access memory (SRAM) cache, a memory controller, and/or any other suitable components. The volatile memory dies 420 (sometimes also referred to collectively herein as a "main memory") can be DRAM memory dies that provide low latency memory access to the combined HBM device 400. In contrast, the non-volatile memory die 430 (sometimes referred to herein as a "secondary memory die," "memory extension," a "memory extension die," and the like) can provide a non-volatile storage device (e.g., a NAND flash device) for the combined HBM device 400. Further, the non-volatile memory die 430 can provide a significant extension of the available memory (e.g., two times, three times, four times, five times, ten times or any other suitable increase in the memory capacity of the volatile memory dies 420). In a specific, non-limiting example, each of the volatile memory dies 420 can provide 4 GB of memory while the non-volatile memory die 430 can provide 64 GB of memory. As a result, the four volatile memory dies 420 illustrated in FIG. 4 provide a total memory of 16 GB and the non-volatile memory die 430 provides four times the total memory of the volatile memory dies 420. In this example, an SiP device using (e.g., the SiP device 300 of FIG. 3) can avoid the latency of loading memory from an external storage component (and through a low bandwidth communication channel) into the volatile memory dies 420 for each round of processing through the 64 GB of data that can be stored in the non-volatile memory die 430.

In the illustrated embodiment, the shared HBM bus 440 includes a plurality of TSVs 442 (four illustrated in FIG. 4, but any suitable number of TSVs is possible) extending from the interface die 410, through the volatile memory dies 420, to the non-volatile memory die 430. Each of the TSVs 442 can support an independent, bidirectional read/write operation to communicate data between the dies in the combined HBM device 400 (e.g., between the interface die 410 and the volatile memory dies 420, between the non-volatile memory die 430 and the volatile memory dies 420, and the like). Because the TSVs 442 establish the shared HBM bus 440 between each of the dies in the combined HBM device 400, the shared HBM bus 440 can reduce (or minimize) the footprint needed to establish high bandwidth communication routes through the combined HBM device 400. As a result, the shared HBM bus 440 can reduce (or minimize) the overall footprint of the combined HBM device 400.

Figure 5A:
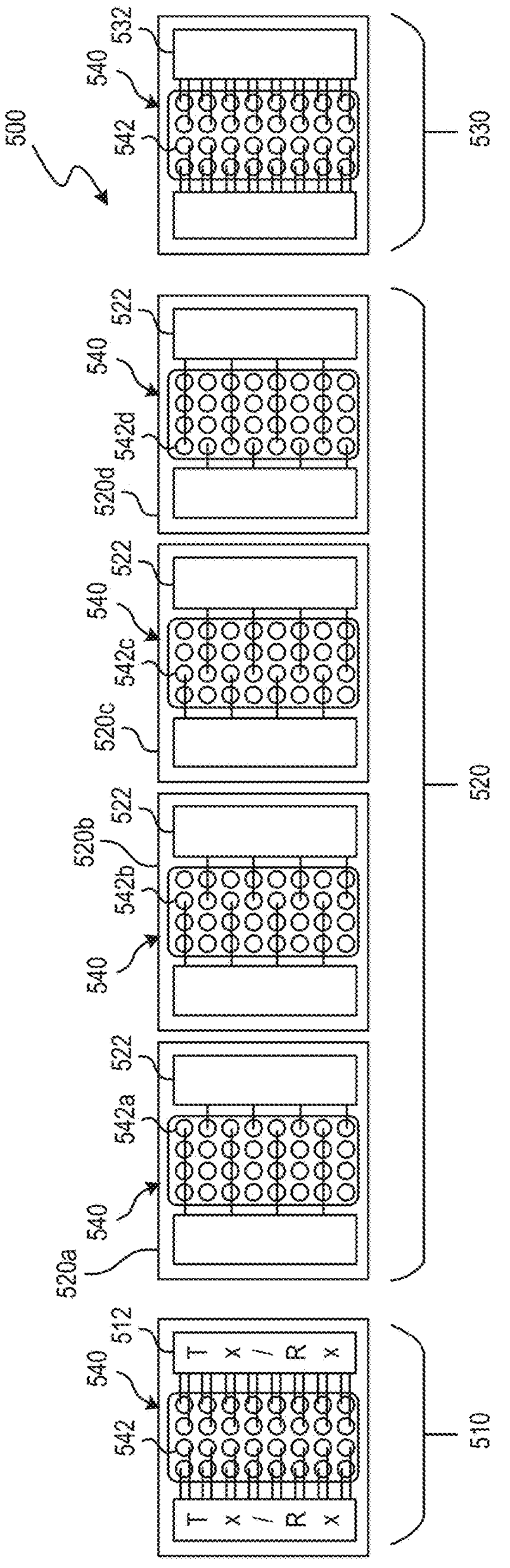
FIG. 5A is a schematic top plan view of components of a combined high-bandwidth memory device configured in accordance with some embodiments of the present technology.

FIG. 5A is a schematic top plan view of components of a combined HBM device 500 configured in accordance with some embodiments of the present technology. As illustrated in FIG. 5A, the combined HBM device 500 is generally similar to the combined HBM device 400 described above with reference to FIG. 4. For example, the combined HBM device 500 includes an interface die 510, one or more volatile memory dies 520 (four illustrated in FIG. 5A), and one or non-volatile memory dies 530 (one illustrated in FIG. 5A), as well as a shared HBM bus 540 communicatively coupling the interface die 510, the volatile memory dies 520, and the non-volatile memory die 530.

The interface die 510 includes one or more read/write components 512 (two illustrated in FIG. 5A). In various embodiments, the read/write components 512 can couple the interface die 510 to an external component (e.g., to the base substrate 310 of FIG. 3), present information on the combined HBM device 500 and/or dies of the combined HBM device 500 to an external component (e.g., the CPU/GPU 320 of FIG. 3), and/or include memory controlling functionality to control movement of data between the volatile memory dies 520 and/or the non-volatile memory die 530. The volatile memory dies 520 each include memory circuits 522 (e.g., lines of capacitors and/or transistors) that can store data in volatile arrays. The non-volatile memory die 530 includes memory circuits 532 (e.g., NAND flash memory and/or NOR flash memory) that have a larger storage capacity than the memory circuits 522 of the volatile memory dies 520.

As further illustrated in FIG. 5A, the shared HBM bus 540 can include a plurality of TSVs 542 (thirty-two illustrated in FIG. 5A) that extend between each of the interface die 510, the volatile memory dies 520, and the non-volatile memory die 530. Further, the TSVs 542 can be organized into subgroups (e.g., rows, columns, and/or any other suitable subgrouping) that are selectively coupled to the dies in the combined HBM device 500 to simplify signal routing. For example, in the embodiment illustrated in FIG. 5A, a first memory die 520*a* can be selectively coupled to a first subgrouping 542*a* of the TSVs 542 (e.g., the right-most column of the TSVs 542). Accordingly, read/write operations on the first memory die 520*a* must be performed through the first subgrouping 542*a* of the TSVs 542. Similarly, as further illustrated in FIG. 5A, a second memory die 520*b* can be selectively coupled to a second subgrouping 542*b* of the TSVs 542, a third memory die 520*c* can be selectively coupled to a third subgrouping 542*c* of the TSVs 542, and a fourth memory die 520*d* can be selectively coupled to a fourth subgrouping 542*d* of the TSVs 542. In the illustrated embodiment, each of the first-fourth subgroupings 542*a*-542*d* is completely separate from the other subgroupings. As a result, each of the volatile memory dies 520 is fully separately addressed, despite being coupled to the shared HBM bus 540. However, it will be understood that, in some embodiments, the first-fourth subgroupings 542*a*-542*d* can share one or more of the TSVs 542 and/or that each of the first-fourth volatile memory dies 520*a*-520*d* can be coupled to a shared subgrouping of the TSVs 542 to allow one or more read/write operations to send data to multiple of the first-fourth volatile memory dies 520*a*-520*d* at once (e.g., allowing the second memory die 520*b* to store a copy of the data for the first memory die 520*a*).

In the embodiment illustrated in FIG. 5A, the interface die 510 is coupled to each of the TSVs 542. As a result, the interface die 510 can clock and help route read/write signals to any suitable destination. Similarly, the non-volatile memory die 530 is coupled to each of the TSVs 542. As a result, the non-volatile memory die 530 can use any available subgrouping of the TSVs 542 (and/or all of the TSVs 542) to send and/or receive read/write signals to store backups of the data in the volatile memory dies 520, store large sets of data that can then be partitioned out to the volatile memory dies 520, quickly store a current state of the volatile memory dies 520 during a power-down and/or idle operation, quickly write a previous state of the volatile memory dies 520 during a power-up and/or wake-up operation, and/or execute various other suitable operations. Further, because the interface die 510 and the non-volatile memory die 530 can communicate using each of the TSVs 542 (while each of the volatile memory dies 420 can communicate with the interface die 410 using a subset of the TSVs 542), the bandwidth of the communication can be greater than the bandwidth to any individual one of the volatile memory dies 520. In the illustrated embodiment, for example, the bandwidth between the interface die 510 and the non-volatile memory die 530 is four times greater than the bandwidth between the interface die 510 and any individual one of the volatile memory dies 520.

Figure 5B:
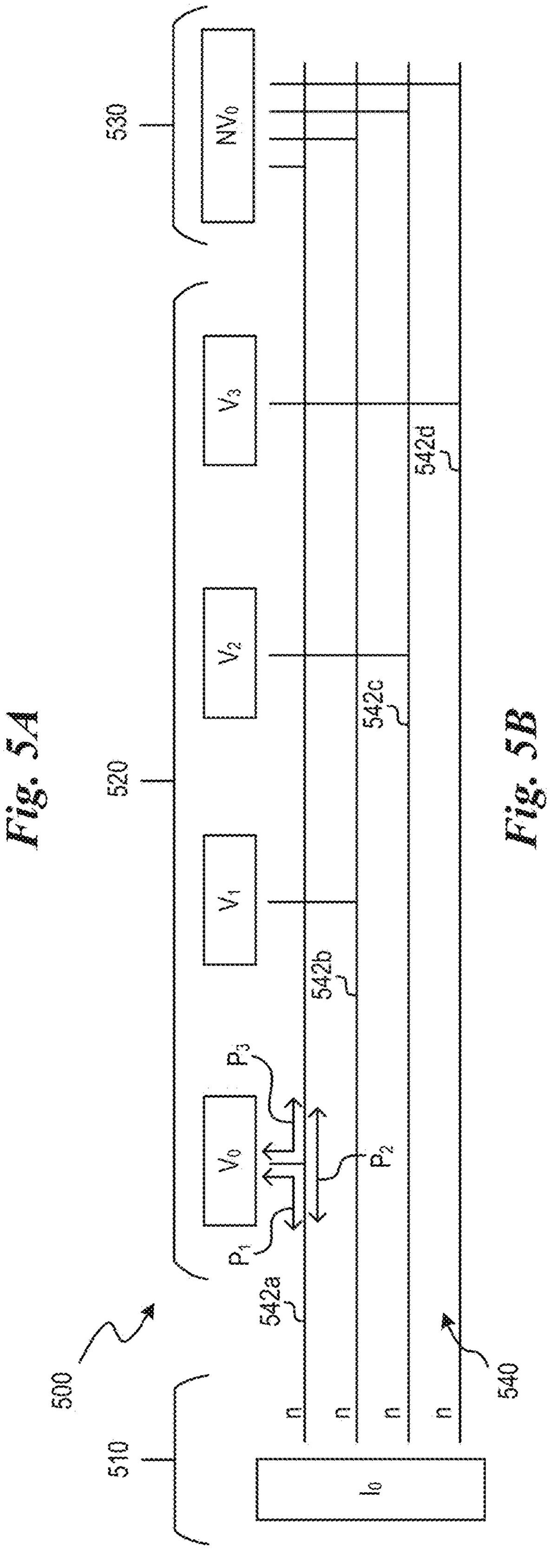
FIG. 5B is a schematic routing diagram for signals through the combined high-bandwidth memory device in accordance with some embodiments of the present technology.

FIG. 5B is a schematic routing diagram for signals through the combined HBM device 500 of FIG. 5A in accordance with some embodiments of the present technology. In FIG. 5B, the TSVs 542 are represented schematically by horizontal lines while the connections to the TSVs 542 (e.g., by the volatile memory dies 520 and the non-volatile memory die 530) are illustrated by vertical lines that intersect with the horizontal lines. It will be understood that each intersection can represent a connection to one or more of the TSVs 542 (e.g., eight of the TSVs 542 illustrated in each of the first-fourth subgroupings 542*a*-542*d* of FIG. 5A, a single TSV, two TSVs, and/or any other suitable number of connections).

In the embodiment illustrated in FIG. 5B, the volatile memory dies 520 are selectively coupled to the first-fourth subgroupings 542*a*-542*d* of the TSVs 542 while interface die 510. For example, a first volatile link $V_0$ (corresponding to the first volatile memory die 520*a* of FIG. 5A) is coupled to the first subgrouping 542*a*, a second volatile link $V_1$ (corresponding to the second volatile memory die 520*b*) is coupled to the first subgrouping 542*b*, a third volatile link $V_2$ (corresponding to the third volatile memory die 520*c* of FIG. 5A) is coupled to the third subgrouping 542*c*, and a fourth volatile link $V_3$ (corresponding to the fourth volatile memory die 520*d* of FIG. 5A) is coupled to the fourth subgrouping 542*d*. Further, the non-volatile memory die 530 is coupled to each of the first-fourth subgroupings 542*a*-542*d* of the TSVs 542 (e.g., at a non-volatile link $NV_0$). As a result, for example, a signal from the interface die 510 (e.g., a read request forwarded from an external component, such as the CPU/GPU 320 of FIG. 3) can be forwarded (via an interface link $I_0$) onto the second subgrouping 542*b*. Consequently, the signal can only be received by the second volatile link $V_1$ (e.g., the second memory die 520*b* of FIG. 5A) and/or the non-volatile memory die 530.

As further illustrated in FIG. 5B, signals in the combined HBM device 500 can move along any of three bidirectional paths between any two of the interface die 510, one of the volatile memory dies 520, and the non-volatile memory die 530. For example, a first signal path $P_1$ extends between the interface die 510 and the volatile memory dies 520. The first signal path $P_1$ can be used during normal operation of the combined HBM device 500 to perform any number of read/write operations between the interface die 510 (and any suitable component beyond, such as the CPU/GPU 320 of FIG. 3) and the volatile memory dies 520. A second signal path $P_2$ extends between the volatile memory dies 520 and the non-volatile memory die 530. The second signal path $P_2$ can be used to write a subset of the data in the non-volatile memory die 530 (e.g., a subset of data for an AI/ML algorithm) from the non-volatile memory die 530 to the volatile memory dies 520, write results of some computer processing to the non-volatile memory die 530, write a current state of the volatile memory dies 520 to the non-volatile memory die 530, write a previous state of the volatile memory dies 520 from the non-volatile memory die 530 to the volatile memory dies 520, and/or perform any other suitable operation. A third signal path $P_3$ extends between the interface die 510 and the non-volatile memory die 530. The third signal path $P_3$ can be used to write a large data set directly to the extension dies 530 (e.g., to be used at various stages of an AI/ML algorithm, used while rendering a graphic, and the like), store information from other locations (e.g., a current state of the L1 and L2 caches 226, 228 of FIG. 2), retrieve a previous state of other locations, and/or perform any other suitable operation. Because the operations described above with reference to the second and third signal travel paths $P_2$, $P_3$ use the same high bandwidth channels as the first signal travel path $P_1$ (i.e., the TSVs 542 in the shared HBM bus 540), the operations can be completed at a relatively fast rate (e.g., compared to performing the same read/write operations from the storage device 240 of FIG. 2).

The bidirectional restriction of each of the TSVs 542 in the illustrated embodiment prevents any subset of the TSVs 542 from being used for multiple operations at the same time (e.g., along the first and third travel paths $P_1$, $P_3$ at the same time). However, it will be understood that, in some embodiments, one or more of the signal travel paths can have multiple destinations. For example, a write operation to one of the volatile memory dies 520 along the first signal travel path $P_1$ can write data to the non-volatile memory die 530 along the third signal travel path $P_3$ at the same time. Further, the first subgrouping **542*a* can be used for a first operation (e.g., writing data from the non-volatile memory die 530 to one of the volatile memory dies 520 along the second signal travel path $P_2$) at the same time the second subgrouping 542*b* is used for a second operation (e.g., writing data from the interface die 510 to the non-volatile memory die 530 along the third signal travel path $P_3$). Still further, as discussed in more detail below, the shared HBM bus 540 can include additional TSVs and/or additional subgroupings of the TSVs to allow subgroupings to be dedicated to various signal travel paths at the cost of the shared HBM bus 540** having a larger footprint.

Figure 6:
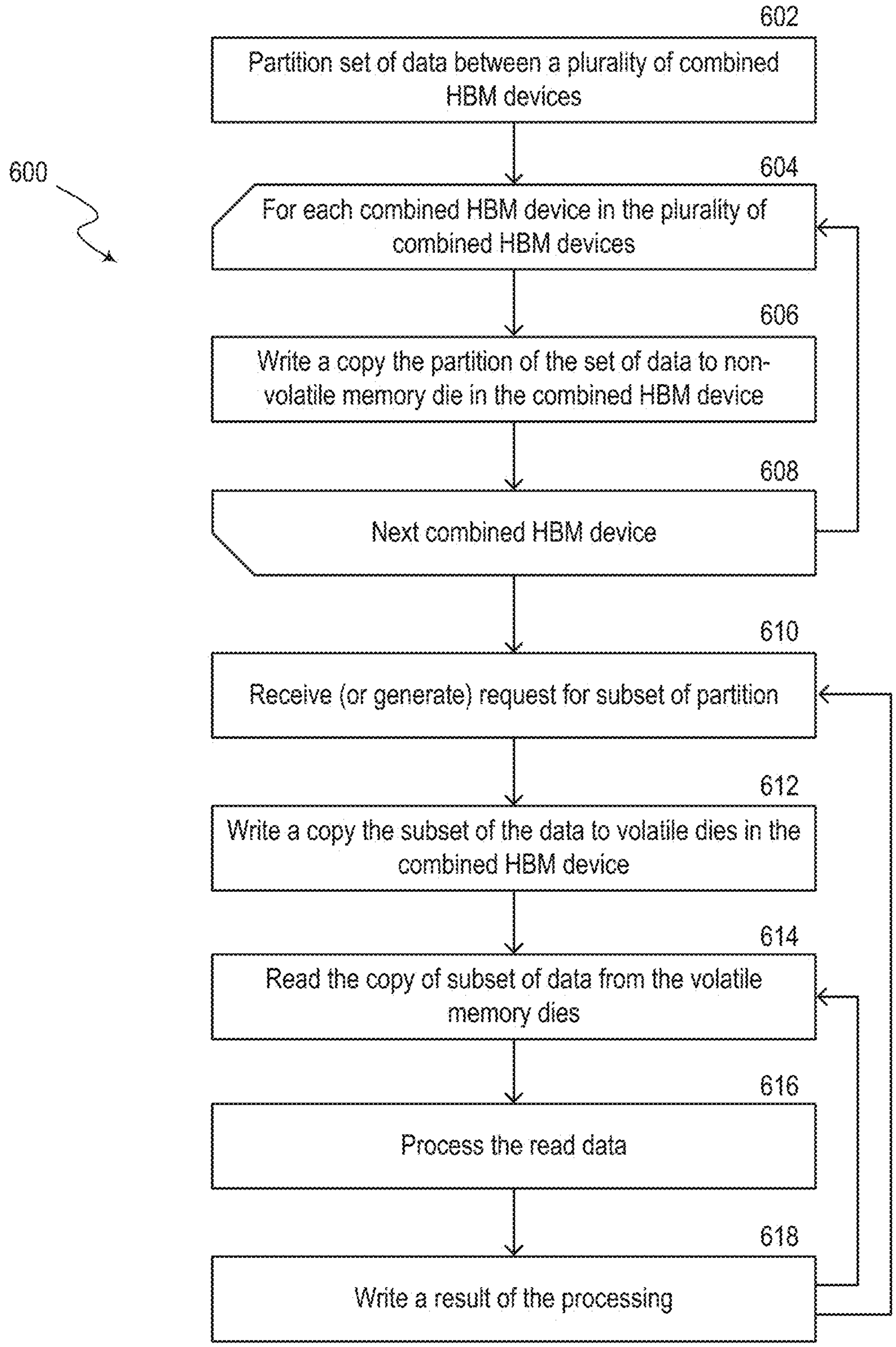
FIG. 6 is a flow diagram of a process for operating a combined high-bandwidth memory device in accordance with some embodiments of the present technology.

FIG. 6 is a flow diagram of a process 600 for operating a combined HBM device in accordance with some embodiments of the present technology. The process 600 can be completed by a controller in communication with the SiP device (e.g., a package controller) and/or on-board the SiP device (e.g., the CPU/GPU 320 of FIG. 3) to load, manage, and/or process data in the combined HBM device.

The process 600 can begin at block 602 with partitioning a set of data. The set of data can be partitioned so that each partition fits within a combined HBM device, within the total non-volatile storage of a combined HBM device, within an individual non-volatile memory die of a combined HBM device, and/or a SiP device. Additionally, or alternatively, the set of data can be partitioned according to an external requirement (e.g., according to a desired batch size for data in an AI/ML process, to maximize resource utilization during a computational process, and the like). In a specific, non-limiting example, a SiP device can include four combined HBM devices (each including volatile and non-volatile memory) similar to the combined HBM devices discussed above with reference to FIGS. 4-5B, each having a non-volatile memory die that provides 64 GB of memory. In this example, a dataset with 256 GB of data can be portioned into four partitions of 64 GB, each of which can be loaded into the non-volatile memory die of a combined HBM device for processing.

In various embodiments, partitioning the data can be based on necessary divisions (e.g., based on the space available in each combined HBM device), desired data sizes (e.g., based on batch size considerations for an AI/ML process to improve generalization and convergence speed), available processing space, other computational requirements (e.g., other memory devices already in use), and/or various other suitable considerations. In some embodiments, the dataset is smaller than the available space in a single non-volatile memory die of a combined HBM device, allowing the process 600 to skip block 602.

As described herein, the process 600 loops through blocks 604-608 for each combined HBM device that will receive a partition of the set of data. That is, at block 604 the process selects a combined HBM device from the plurality of combined HBM devices of the SiP. At block 606, the process 600 includes writing a copy of the partition of the set of data to a non-volatile memory die (e.g., the non-volatile memory die 430 of FIG. 4, sometimes also referred to herein as a "memory extension") in the combined HBM device. The write operation at block 606 can move a copy of the data from a storage component (e.g., the storage device 240 of FIG. 2) into the combined HBM device for use during a processing operation. As a result, the write operation at block 606 can be limited by the bandwidth of the communication path with the storage component (e.g., the bottleneck described above with reference to FIG. 1). Consequently, the write operation can take several seconds to complete. However, as discussed in more detail below, the data is then available via a high bandwidth communication path, allowing the data to be used any number of times without going through the bottleneck at the storage component.

At block 608, if the combined HBM device is not the last designated to receive data from the set, the process 600 returns to block 604 to select the next combined HBM device in which to write another partition of the set of data. If each combined HBM device has been addressed, the process proceeds to block 610.

It will be understood that although the process 600 at blocks 604-608 has been described as an iterative process separate from any of the other blocks in FIG. 6, the process 600 is not so limited. Purely by way of example, the process 600 can simultaneously execute blocks 610-618 for each combined HBM device that has a partition of the set of data stored thereon and blocks 604-608 to continue to write partitions of the set of data to additional combined HBM devices. In such embodiments, the simultaneous execution of multiple blocks in the process 600 helps reduce delays associated with the low bandwidth communication path from the storage component.

At block 610, the process 600 includes receiving (or generating) a request for a subset of the partition in a specific combined HBM device. The request can be received from, for example, a CPU/GPU in SiP device and/or any other suitable controller. Additionally, or alternatively, the request can be generated by a controller in the combined HBM device (e.g., by the interface die 410 of FIG. 4) in anticipation of the data being needed by an external component and/or based on a previous request from the external component. As described herein, the requested subset of data may be in the non-volatile memory die (e.g., the memory extension) of the combined HBM device.

At block 612, the process 600 includes writing a copy of the subset of the data (or causing the subset of the data to be written), from the non-volatile memory die, to one or more volatile memory dies in the combined HBM device (e.g., the memory dies 420 of FIG. 4, sometimes referred to herein as the "main memory"). The write operation can use the shared bus in the combined HBM device to write the data using a high bandwidth, short communication path. As a result, the write operation at block 612 can be executed in a timeframe on the order of tens of microseconds, such that the subset is available almost instantly. Once stored in the memory dies, the subset of data is available for typical use by a controller and/or processing unit via a high bandwidth communication path.

For example, at block 614, the process 600 includes reading the subset of data in the volatile memory dies. The read operation can move a copy of the subset into a processing unit (e.g., the processing devices 220 of FIG. 2). At block 616, the process 600 includes processing the subset of the data (e.g., at the CPU/GPU 320 of FIG. 3). And at block 618, the process 600 can write a result of the processing at block 616 to the volatile memory dies and/or to the non-volatile memory die. The read/write operations at blocks 614, 618 can communicate the data using a high bandwidth communication path (e.g., via the shared buses 340, 440 of FIGS. 3 and 4). As a result, the subset of the data is available for processing within tens of microseconds and the result of the processing is saved within tens of microseconds, such that the processing at block 616 is usually the limiting factor on the speed of the process 600 in blocks 614-618. After writing a result of the processing at block 618, the process 600 can return to block 614 to repeat blocks 614-618 any suitable number of times (e.g., when the processing at block 616 is a part of an AI/ML algorithm that iteratively processes the data), and/or can return to block 610 to receive (or generate) a request for a second subset of data in the non-volatile memory die and write the second subset of the data to the volatile memory dies for processing.

In various embodiments, the processing at block 616 can be part of an AI/ML algorithm, a video rendering process, a high-resolution graphics rending process, various complex computer simulations, and/or any other suitable computing applications. In such embodiments, the CPU/GPU will typically call and/or refer to each subset of the data more than once. As a result, the combined HBM architecture discussed above with reference to FIGS. 2-5B allows the process 600 to avoid reading the data from a storage component (and through a low bandwidth communication channel) multiple times. Instead, the data is written into the non-volatile memory die once, then written to the volatile memory dies and read any suitable number of times. While the initial writing operation is subject to the bottleneck constraints of the low bandwidth communication path from the storage component, each subsequent access of the data uses a high bandwidth path. As a result, each subsequent use of the data can require tens of microseconds instead of one or more seconds, potentially increasing the speed of the processing operations by orders of magnitude.

Figure 7A:
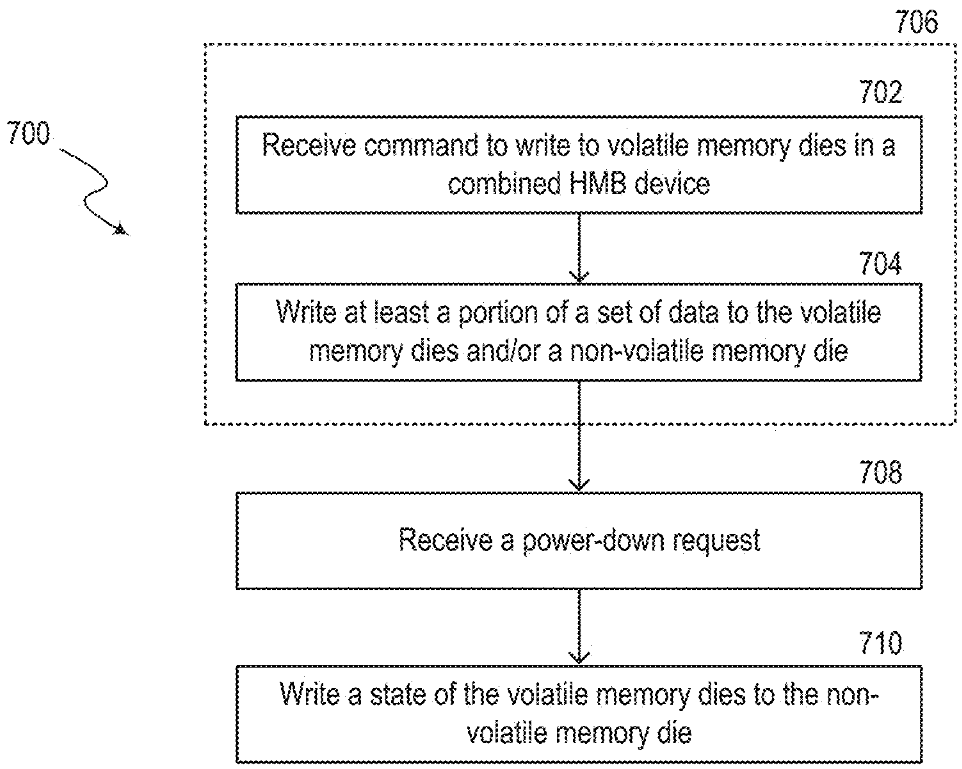
FIGS. 7A and 7B are flow diagrams of processes for powering a system-in-package device down and powering a system-in-package device up, respectively, using a combined high-bandwidth memory device in accordance with some embodiments of the present technology.
Figure 7B:
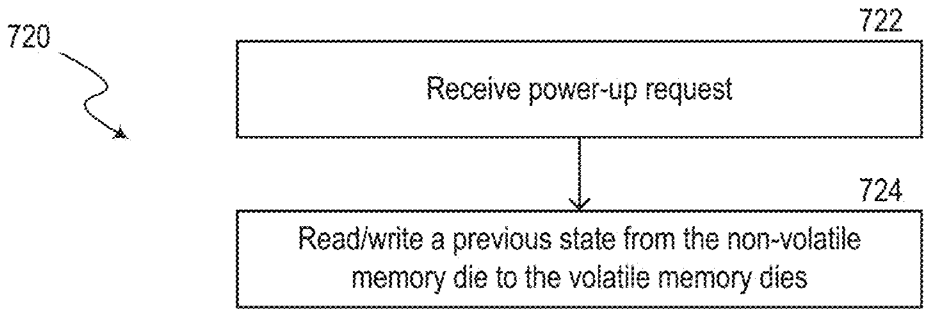

FIGS. 7A and 7B are flow diagrams of processes 700, 720 for powering a SiP device (and/or an associated semiconductor device) down and powering the SiP device up, respectively, using a combined HBM device in accordance with some embodiments of the present technology. The processes 700, 720 can be completed by a controller in communication with the SiP device (e.g., a package controller) and/or on-board the SiP device (e.g., the CPU/GPU 320 of FIG. 3 and/or a controller on the interface die 410 of FIG. 4).

The process 700 of FIG. 7A begins at block 702 by receiving (or generating) a command to write a set of data to one or more volatile memory dies in a combined HBM device (e.g., from a storage device separate from the SiP device). The command can be, for example, in response to a user's request to launch a computing application with the SiP device.

At block 704, the process 700 writes the set of data to the volatile memory dies (e.g., DRAM dies) in the combined HBM device, such that the portion (or all) of the set of data is available for typical processing. Because the non-volatile memory die and the volatile memory dies are both coupled to a shared HBM bus in the combined HBM device, the process 700 at optional block 704 can simultaneously write the set of data to the non-volatile memory die in the combined HBM device. By writing the data to the non-volatile memory die, the process 700 can protect against data loss during a blackout or other sudden loss of power (e.g., damage to a power connection).

The process 700 can complete blocks 702 and 704 (collectively, block 706) any number of times during operation of the SiP to support typical processing in a semiconductor device. During the processing at block 706, the read/write operations can use the high bandwidth communication path to quickly communicate sets of data back and forth between the volatile memory dies and the processing components, allowing the read/write operations to not impose significant time constraints on the processing. Further, in some embodiments, the process 700 includes writing to the non-volatile memory die at block 706 to save a result of various processing operations, save a current state of the SiP device, the combined HBM device, and/or any related semiconductor device. Because the non-volatile memory die is coupled to a high bandwidth communication path (e.g., the shared HBM bus 440 of FIG. 4), the saves can protect against a blackout or other loss of power without requiring a significant time investment and/or pause in processing operations. Further, in some embodiments, because any write operation on the volatile memory dies automatically creates a save in the non-volatile memory dies by virtue of their mutual connection to TSVs in the shared HBM bus, the saves may not require any additional time.

At block 708, the process 700 includes receiving a power-down request (sometimes also referred to herein as an idle request). The power-down request can be received in response to an input from a user and/or another component of a system using the SiP device (e.g., to conserve power when an electronic device is running low on battery power and/or in response to a loss of power).

At block 710, the process 700 includes writing a state of the volatile memory dies (and/or any other suitable component of the semiconductor device, such as the L1 and L2 caches 226, 228 of FIG. 2) to the non-volatile memory die in the combined HBM device. Because the non-volatile memory die is coupled to the high bandwidth communication path, the write operation can complete within tens of microseconds (e.g., as opposed to one or more seconds to write the data to a traditional storage device, such as the storage device 240 of FIG. 2). As a result, the SiP device can comply with the power-down request within tens of microseconds, allowing the semiconductor device to save power, reduce losses of data when power is lost, and/or otherwise shut off quickly when requested.

Relatedly, the process 720 of FIG. 7B can begin at block 722 by receiving a power-up request (sometimes also referred to herein as a wake-up request). The power-up request can be received in response to an input from a user and/or another component of a system using the SiP device (e.g., another controller in a semiconductor device). And at block 724 the process 720 can read/write a previous state of the SiP device from the non-volatile memory die to the volatile memory dies and/or any other suitable components (e.g., the L1 and L2 caches 226, 228 of FIG. 2). Similar to the discussion above, because the non-volatile memory die is coupled to the high bandwidth communication path, the SiP device (and the corresponding semiconductor device) can respond to a power-up request within tens of microseconds (e.g., instead of the one or more seconds required to read/write from a traditional storage component). As a result, the SiP device (and the corresponding semiconductor device) can be ready for computational activities significantly faster than a conventional device.

Figure 8:
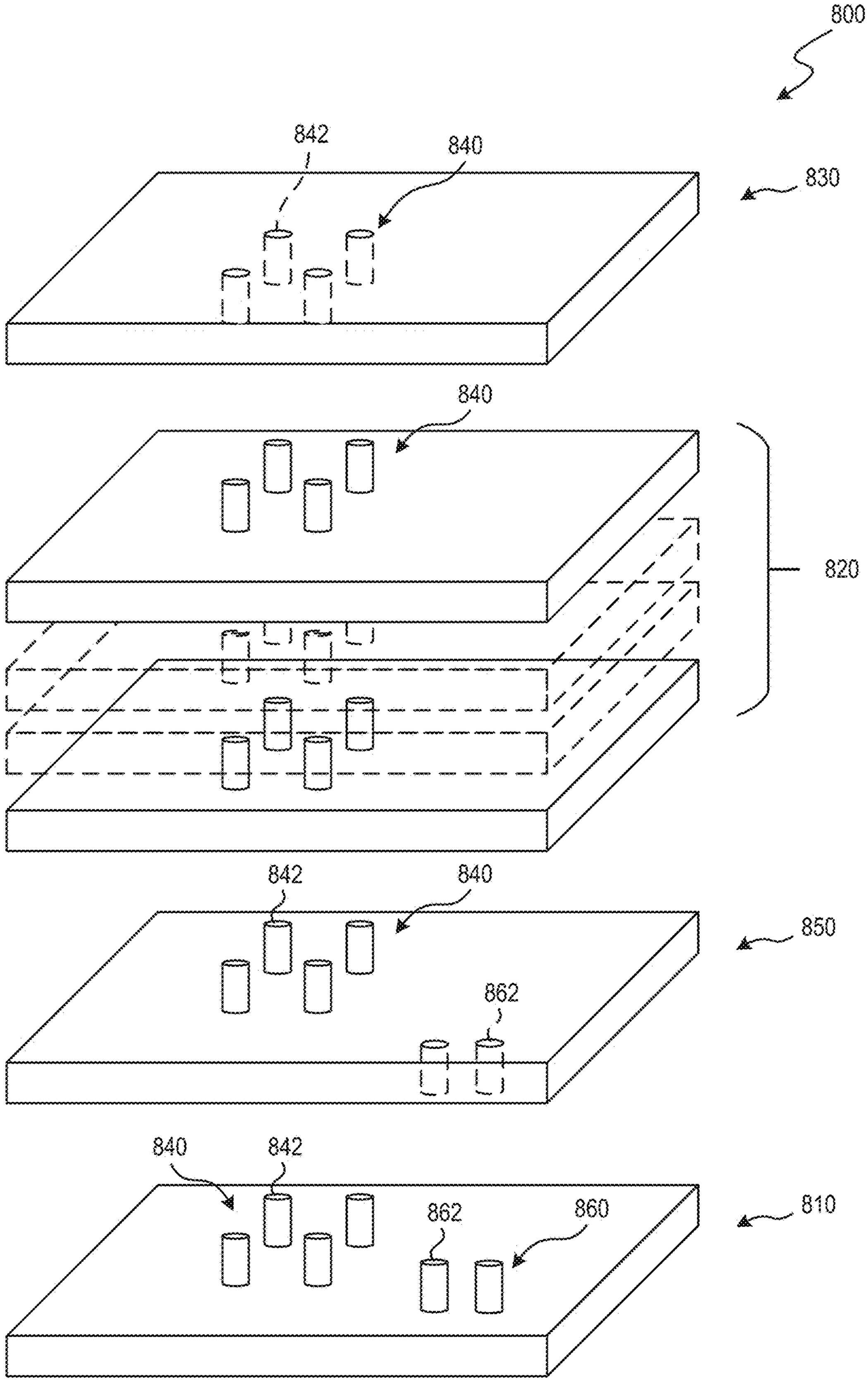
FIG. 8 is a partially schematic exploded view of a combined high-bandwidth memory device configured in accordance with further embodiments of the present technology.

FIG. 8 is a partially schematic exploded view of a combined HBM device 800 configured in accordance with further embodiments of the present technology. As illustrated in FIG. 8, the combined HBM device 800 is generally similar to the combined HBM device 400 discussed above with reference to FIG. 4. For example, the combined HBM device 800 includes the combined HBM device 800 includes an interface die 810, one or more volatile memory dies 820 (four illustrated in FIG. 8), and one or non-volatile memory dies 830 (one illustrated in FIG. 8). The combined HBM device 800 includes a shared HBM bus 840 with a plurality of TSVs 842 communicatively extending between and coupled to the interface die 810, the volatile memory dies 820, and the non-volatile memory die 830.

As further illustrated in FIG. 8, however, the combined HBM device 800 can also include one or more additional dies 850 (one illustrated in FIG. 8) and an auxiliary HBM bus 860 with a plurality of isolated TSVs 862 (two illustrated) coupling the additional die(s) 850 to the interface die 810. In various embodiments, the additional die(s) 850 can include a static random-access memory (SRAM) die (e.g., providing a cache to the combined HBM device 800, acting as the L2 cache 228 of FIG. 2, acting as an L3 (or higher) cache, and/or the like), a controller die or other processing unit, a logic die, and/or any other suitable component. In the illustrated embodiment, the additional die 850 is positioned between the interface die 810 and the volatile memory dies 820. This positioning can minimize the length of the auxiliary bus 860 and/or avoid requiring the isolated TSVs 862 to extend through the volatile memory dies 820 and/or the non-volatile memory die 830.

However, it will be understood that the additional die(s) 850 can be positioned in various other locations in the combined HBM device, such as between the volatile memory dies 820 and the non-volatile memory die 830, above the non-volatile memory die 830, below the interface die 810, and/or in any other suitable position. Further, the additional die 850 can be coupled to the interface die 810 through the TSVs 842 in the shared HBM bus 840 in addition to (or instead of) through the isolated TSVs 862 in the auxiliary bus 860. Embodiments that omit the auxiliary bus 860 can reduce the footprint required on the interface die 810 to interconnect each of the dies in the combined HBM device 800 while requiring all traffic to move along the TSVs 842 in the shared HBM bus 840.

Figure 9:
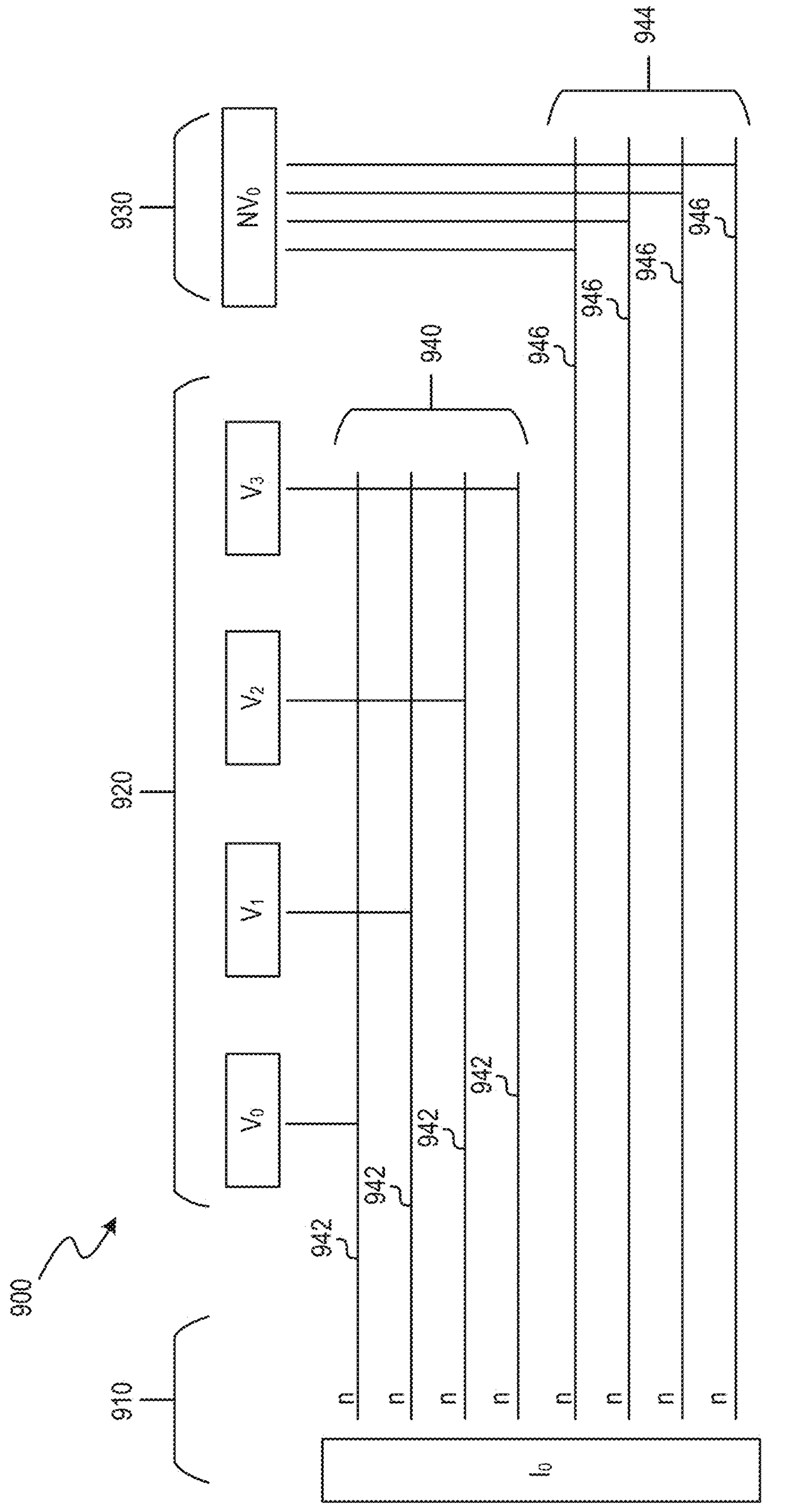
FIG. 9 is a schematic routing diagram for signals through a combined high-bandwidth memory device in accordance with some embodiments of the present technology.

FIG. 9 is a schematic routing diagram for signals through a combined HBM device 900 in accordance with further embodiments of the present technology. As illustrated in FIG. 9, the combined HBM device 900 is generally similar to the combined HBM device 500 discussed above with reference to FIGS. 5A and 5B. For example, the combined HBM device 900 (illustrated schematically) includes an interface die 910, as well as volatile memory dies 920 and an non-volatile memory die 930 each communicably coupled to the interface die 910. However, in the illustrated embodiment, the combined HBM device 900 includes a first bus 940 coupled between the interface die 910 and the volatile memory dies 920 and a second bus 944 coupled between the interface die 910 and the non-volatile memory die 930.

The first bus 940 includes a plurality of first TSVs 942. As illustrated by the intersection between horizontal lines n and vertical lines m, the first TSVs 942 are selectively coupled to the volatile memory dies 920 to establish individual communication paths. As a result, for example, each of the memory dies can be individually addressed by signals from the (e.g., read/write signals) from the interface die 910 (and any external component coupled thereto). In contrast, the second bus 944 includes a plurality of second TSVs 946 that are each coupled to the non-volatile memory die 930, thereby establishing a communication path with a relatively high (e.g., compared to the communication path each of the volatile memory dies 920) bandwidth between the interface die 910 and the non-volatile memory die 930. Including both the first and second busses 940, 944 into the combined HBM device 900 can require a larger footprint to establish the communication paths between each of the dies. However, including both the first and second busses 940, 944 into the combined HBM device 900 can allow, for example, a new set of data to be written to the non-volatile memory die 930 while a subset of a previous set of data is being processed via communication with the volatile memory dies 920. Additionally, or alternatively, a result of one computation using data in the volatile memory dies 920 can be stored in the non-volatile memory die 930 while the data is being used for a second computation.

In the embodiment illustrated in FIG. 9, the first bus 940 is only communicably coupled between the interface die 910 and the volatile memory dies 920. However, it will be understood that the first TSVs 942 can extend and be communicably coupled to the non-volatile memory die 930. As a result, for example, a new set of data can be loaded to the non-volatile memory die 930 through the second bus 944, then distributed from the non-volatile memory die 930 to the volatile memory dies 920 (in subsets or altogether) through the first bus 940. In such embodiments, the communication path between the non-volatile memory die 930 and the volatile memory dies 920 is reduced because signals do not have to travel from the non-volatile memory die 930 to the interface die 910 then from the interface die 910 to the volatile memory dies 920.

Additionally, or alternatively, the volatile memory dies 920 can be communicably coupled to the second bus 944. In such embodiments, for example, data can be routed from the non-volatile memory die 930 to the volatile memory dies 920 through the second bus 944, then routed from the volatile memory dies 920 to a processing component (e.g., the CPU/GPU 320 of FIG. 3) through the first bus 940. In a specific, non-limiting example, each of the volatile memory dies 920 can be communicably coupled to each of the second TSVs 946 in the second bus 944. As a result, signals (e.g., start/stop commands, power-down commands, and the like) that are common between each of the volatile memory dies 920 can be routed through one of the second TSVs 946 to reach each of the volatile memory dies 920 along a single communication path while the other TSVs are used for other signals.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded. Further, the terms "generally", "approximately," and "about" are used herein to mean within at least within 10 percent of a given value or limit. Purely by way of example, an approximate ratio means within ten percent of the given ratio.

Several implementations of the disclosed technology are described above in reference to the figures. The computing devices on which the described technology may be implemented can include one or more central processing units, memory, input devices (e.g., keyboard and pointing devices), output devices (e.g., display devices), storage devices (e.g., disk drives), and network devices (e.g., network interfaces). The memory and storage devices are computer-readable storage media that can store instructions that implement at least portions of the described technology. In addition, the data structures and message structures can be stored or transmitted via a data transmission medium, such as a signal on a communications link. Thus, computer-readable media can comprise computer-readable storage media (e.g., "non-transitory" media) and computer-readable transmission media.

It will also be appreciated that various modifications may be made without deviating from the disclosure or the technology. For example, the dies in the combined HBM device can be arranged in any other suitable order (e.g., with the non-volatile memory die(s) positioned between the interface die and the volatile memory dies; with the volatile memory dies on the bottom of the die stack; and the like). Further, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. For example, although discussed herein as using a non-volatile memory die (e.g., a NAND die and/or NOR die) to expand the memory of the combined HBM device, it will be understood that alternative memory extension dies can be used (e.g., larger-capacity DRAM dies and/or any other suitable memory component). While such embodiments may forgo certain benefits (e.g., non-volatile storage), such embodiments may nevertheless provide additional benefits (e.g., reduce the traffic through the bottleneck, allowing many complex computation operations to be executed relatively quickly, etc.).

Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A system-in-package (SiP) device, comprising:

a base substrate;

a processing unit carried by the base substrate; and a combined high-bandwidth memory (HBM) device carried by the base substrate and electrically coupled to the processing unit through one or more traces, wherein the combined HBM device comprises:

an interface die;

a plurality of volatile memory dies carried by the interface die, the plurality of volatile memory dies comprising a first volatile memory die and a second volatile memory die;

one or more non-volatile memory dies carried by the one or more volatile memory dies; and a shared bus comprising a plurality of through substrate vias extending from the interface die to the one or more non-volatile memory dies such that the shared bus is electrically coupled to each of the interface die, the plurality of volatile memory dies, and the one or more non-volatile memory dies, wherein the plurality of through substrate vias comprises:

a first subset selectively coupled to the interface die, the first volatile memory die, and the one or more non-volatile memory dies; and a second subset selectively coupled to the interface die, the second volatile memory die, and the one or more non-volatile memory dies.

2. The SiP device of claim 1 wherein the combined HBM device further comprises:

a controller die carried by the interface die beneath the plurality of volatile memory dies; and one or more auxiliary through substrate vias extending from the interface die and the controller die.

3. The SiP device of claim 1 wherein the one or more non-volatile memory dies are configured to provide non-volatile copy of data stored in the plurality of volatile memory dies accessible to the plurality of volatile memory dies via the shared bus in response to a power-up request.

4. The SiP device of claim 1 wherein the plurality of volatile memory dies collectively have a first storage capacity, and wherein the one or more non-volatile memory dies collectively have a second storage capacity at least four times the first storage capacity.

5. The SiP device of claim 1 wherein the one or more non-volatile memory dies are configured to store a state of the plurality of volatile memory dies in response to a power-down request.

6. The SiP device of claim 1 wherein the interface die includes a memory controller.

7. The SiP device of claim 1 wherein the combined HBM device further comprises a second bus electrically coupled between the interface die and the one or more non-volatile memory dies, wherein the second bus is separate from the shared bus.

8. The SiP device of claim 7 wherein the second bus includes a plurality of second through substrate vias that are each electrically coupled to the one or more non-volatile memory dies.

9. The SiP device of claim 7 wherein the shared bus is configured to communicate data between the interface die and the plurality of volatile memory dies while the second bus is configured to simultaneously communicate data between the interface die and the one or more non-volatile memory dies.

10. The SiP device of claim 1 wherein the combined HBM device is configured to transfer a subset of data from the one or more non-volatile memory dies to the plurality of volatile memory dies via the shared bus in response to a request from the processing unit.

11. The SiP device of claim 1 wherein the one or more non-volatile memory dies are configured to update a saved state of the SiP device every time data is written to the plurality of volatile memory dies via the shared bus.

12. A system-in-package (SiP) device, comprising:

a base substrate;

a processing unit carried by the base substrate; and a combined high-bandwidth memory (HBM) device carried by the base substrate and electrically coupled to the processing unit, wherein the combined HBM device comprises:

an interface die;

one or more volatile memory dies carried by the interface die;

one or more non-volatile memory dies carried by the one or more volatile memory dies;

a first bus including a plurality of first through substrate vias electrically coupled between the interface die and the one or more volatile memory dies; and a second bus including a plurality of second through substrate vias electrically coupled between the interface die and the one or more non-volatile memory dies, wherein the second bus is separate from the first bus.

13. The SiP device of claim 12 wherein the plurality of first through substrate vias extend from the interface die, through the one or more volatile memory dies, to the one or more non-volatile memory dies.

14. The SiP device of claim 12 wherein the one or more volatile memory dies are selectively coupled to the plurality of first through substrate vias.

15. The SiP device of claim 12 wherein the one or more non-volatile memory dies are electrically coupled to each of the plurality of second through substrate vias.

16. The SiP device of claim 12 wherein the first bus is configured to communicate data between the interface die and the one or more volatile memory dies while the second bus is configured to simultaneously communicate data between the interface die and the one or more non-volatile memory dies.

17. A combined high-bandwidth memory (HBM) device, comprising:

an interface die including a memory controller;

a plurality of volatile memory dies stacked over and carried by the interface die, wherein the plurality of volatile memory dies includes a first volatile memory die and a second volatile memory die;

a non-volatile memory die over and carried by the interface die; and a shared bus including a plurality of through substrate vias (TSVs) extending from the interface die to both the plurality of volatile memory dies and the non-volatile memory die, wherein the plurality of TSVs includes:

a first subgroup selectively coupled between the interface die, the first volatile memory die, and the non-volatile memory die; and a second subgroup selectively coupled between the interface die, the second volatile memory die, and the non-volatile memory die.

18. The combined HBM device of claim 17 wherein:

the plurality of volatile memory dies includes at least a first volatile memory die and a second volatile memory die;

the plurality of TSVs are organized into subgroups including at least a first subgroup and a second subgroup;

the first subgroup is selectively coupled to the first volatile memory die; and the second subgroup is selectively coupled to the second volatile memory die.

* * * * *